(12) United States Patent
Wischnewskij et al.

(10) Patent No.: US 7,598,656 B2
(45) Date of Patent: Oct. 6, 2009

(54) PIEZOELECTRIC ULTRASOUND MOTOR

(75) Inventors: Wladimir Wischnewskij, Waldbronn (DE); Alexej Wischnewskij, Woerth (DE)

(73) Assignee: Physik Instrumente (PI) GmbH & Co. KG, Karlsruhe (DE)

( * ) Notice: Subject to any disclaimer, the term of this patent is extended or adjusted under 35 U.S.C. 154(b) by 0 days.

(21) Appl. No.: 11/596,653

(22) PCT Filed: May 13, 2005

(86) PCT No.: PCT/EP2005/005287

§ 371 (c)(1),
(2), (4) Date: Nov. 29, 2007

(87) PCT Pub. No.: WO2005/114760

PCT Pub. Date: Dec. 1, 2005

(65) Prior Publication Data

US 2008/0073999 A1 Mar. 27, 2008

(30) Foreign Application Priority Data

May 18, 2004 (DE) .................. 10 2004 024 656

(51) Int. Cl.
*H01L 41/09* (2006.01)
(52) U.S. Cl. ............................... 310/323.01
(58) Field of Classification Search ............ 310/328, 310/323.01, 323.03, 323.16, 323.17; *H01L 41/08, H01L 41/09*
See application file for complete search history.

(56) References Cited

U.S. PATENT DOCUMENTS 5,453,653 A  9/1995  Zumeris ............... 310/323.16

(Continued)

FOREIGN PATENT DOCUMENTS

EP         1267425         12/2002

(Continued)

OTHER PUBLICATIONS

Vyshnevskyy( A Novel, Single-Mode Piezoceramic Plate Actuator for Ultrasonic Linear Motors, IEEE Transaction on Ultrasonic, Ferroelectrics, and Frequency Control, vol. 52, No. 11,Nov. 2005).*

(Continued)

*Primary Examiner*—Quyen Leung
*Assistant Examiner*—Karen B Addison
(74) *Attorney, Agent, or Firm*—Gerald T. Bodner

(57) ABSTRACT

The invention relates to a piezoelectric ultrasound motor with an oscillator in the form of a piezoelectric plate of the length L and the height H as well as with one or two friction elements which are arranged at the oscillator and elastically pressed against the friction surface of the part to be moved. According to the invention, the piezoelectric plate is divided into two identical parts by a section plane extending vertically to the large surfaces, with at least one of these parts including an asymmetrical generator of an asymmetrical acoustic standing wave, which upon its activation generates an asymmetrical two-dimensional standing wave, so that the friction elements which are arranged in the center of the long end face of the plate carry out a movement with an inclination relative to the end face, so that the energy of motion is transferred to the element to be moved.

4 Claims, 13 Drawing Sheets

U.S. PATENT DOCUMENTS 5,616,980 A * 4/1997 Zumeris ................ 310/323.16
5,672,930 A   9/1997 Narisawa et al. ....... 310/323.03
6,617,759 B1 * 9/2003 Zumeris et al. ........ 310/323.17

FOREIGN PATENT DOCUMENTS

WO   WO 99/31740   6/1999

OTHER PUBLICATIONS

Wischnewskity W. et al: "New ultrasonic piezoelectric actuator for nanopositioning" Actuator 2004, 9$^{th}$ International Conference on New Actuators, Bremen Germany, Jun. 14, 2004, pp. 118-122, XP009054063 p. 118, right-hand column, last paragraph-p. 119, left-hand column; figures 1,2.

Snitka V. "Stepping ultrasonic motors for precision positioning" Proceedings IEEE 1993 Ultrasonics Symposium, Baltimore, MD, USA, Oct. 31, 1993, pp. 449-452, XP010114997 ISBN: 0-7803-1278-3 p. 449, right-hand column, last paragraph—p. 450, left-hand column, paragraph 1; figure 1.

Nanomotion Ltd., *Product Selection Guide*, Apr. 2004.
Nanomotion Ltd., *HR2 Ultrasonic Motor User Manual*, Mar. 2005.
Nanomotion Ltd., *HR4 Ultrasonic Motor User Manual*, Mar. 2005.
Nanomotion Ltd., *HR8 Ultrasonic Motor User Manual*, Mar. 2005.

\* cited by examiner

41

42

43

PIEZOELECTRIC ULTRASOUND MOTOR

The invention relates to linear and rotary piezoelectric ultrasound motors. The invention may be applied as an electric motor in the usual positioning systems of the equipment technology as well as in fine positioning systems.

From U.S. Pat. No. 5,672,930 piezoelectric ultrasound motors with a metallic resonator are known, to which piezoelectric elements are adhesively attached. The fact has found to be disadvantageous that due to different thermal expansion coefficients of the metallic resonator, on the one hand, and the piezoelectric elements, on the other hand, it is impossible to achieve a high mechanical power with these motors. Moreover, the metallic resonator is a passive body. In order to achieve high rates of motion it is necessary to excite the piezoelectric elements by means of relatively high electric voltages. These drawbacks reduce the reliability of the motor operation and thus limit the fields of application for such motors.

Besides the mentioned piezoelectric motors, primarily piezoelectric ultrasound motors with an acoustic resonator in the form of a monolithic piezoceramic plate are known, at the small end face of which an impact element is arranged. Reference is made herein, for example, to U.S. Pat. No. 5,453,653 or U.S. Pat. No. 5,616,980. On the large surfaces of the piezoceramic plate, generators of acoustic standing waves are arranged, which simultaneously induce a standing bending and a longitudinal wave. As a result of the superposition of the two waves the impact element is subjected to an elliptic motion which imparts the energy of motion to the elements to be moved.

With motors of this type, the fact has found to be disadvantageous that the bending wave is used as the energy-transferring wave, which comprises a low electromechanical coupling factor with the generators. A low coupling factor results in a considerable increase of the excitation voltage of the resonator, in an efficiency reduction of the motors, as well as in a limitation of their power. It is not possible with such motors to increase the mechanical power of the motors by increasing the resonator's size. An increase in length of the piezoceramic plate makes the resonance frequency of the resonator increasingly lower, the consequence of which is a reduction of its specific power. The standard ultrasound motors from Messrs Nanomotion for example, which are constructed to this principle, comprising only one piezoceramic plate as the resonator, have a mechanical power of approx. 0.4 W. For an increase, up to eight such piezoactuators are arranged in a housing (see company brochure under http://www.nanomotion.com/In2000index.html). This measure renders the entire construction of the drives more complicated and reduces their reliability.

In addition, such motors comprise a complicated system of the excitation electrodes, which requires an electrical connection by means of cross-wise diagonally soldered conductors. This additionally reduces the reliability of the motors, because the application of ultrasound often causes the lines to break off the piezoelectric plate.

Another disadvantage to be mentioned is the unfavourable handling in the construction of such motors. The longitudinal axis of the resonator or the actuator, respectively, has to be arranged perpendicularly to the element to be moved. This arrangement leads to an increase in size of the drive systems in which the motors are employed and makes the handling in construction complicated.

It is therefore the object of the invention to eliminate all drawbacks mentioned for the of the above motors, while simultaneously achieving a reduction of the excitation voltage of the motors, an increase of the mechanical power and of the reliability, a simplification of the motor design, a reduction of the manufacturing costs, and an improvement of the handling in the construction of the motors.

The indicated object is solved in that in the piezoelectric ultrasound motor with an oscillator in the form of a piezoelectric plate of the length L and the height H as well as with one or two friction elements which are arranged at the oscillator and elastically pressed against the friction surface of the part to be moved, the mentioned piezoelectric plate is divided into two identical parts by a section plane extending vertically to the large surfaces, with at least one of these parts including an asymmetrical generator of an asymmetrical acoustic standing wave, which upon its activation generates an asymmetrical two-dimensional standing wave, so that the friction elements which are arranged in the centre of the long end faces of the piezoceramic plate carry out movements with an identical inclination relative to the dividing plane, so that the energy of motion is transferred to the element to be moved.

Furthermore, the piezoelectric oscillator may include two asymmetrical generators of an asymmetrical acoustic wave, which are arranged symmetrically with respect to the dividing plane, for the reversal of motion of the part to be moved, so that upon their selective activation the angles between the motion path of the friction elements and the dividing plane change their signs, which causes the force which drives the element to be moved to change its direction.

The invention will be described in more detail in the following with reference to embodiments and to figures in which.

Figure 1:
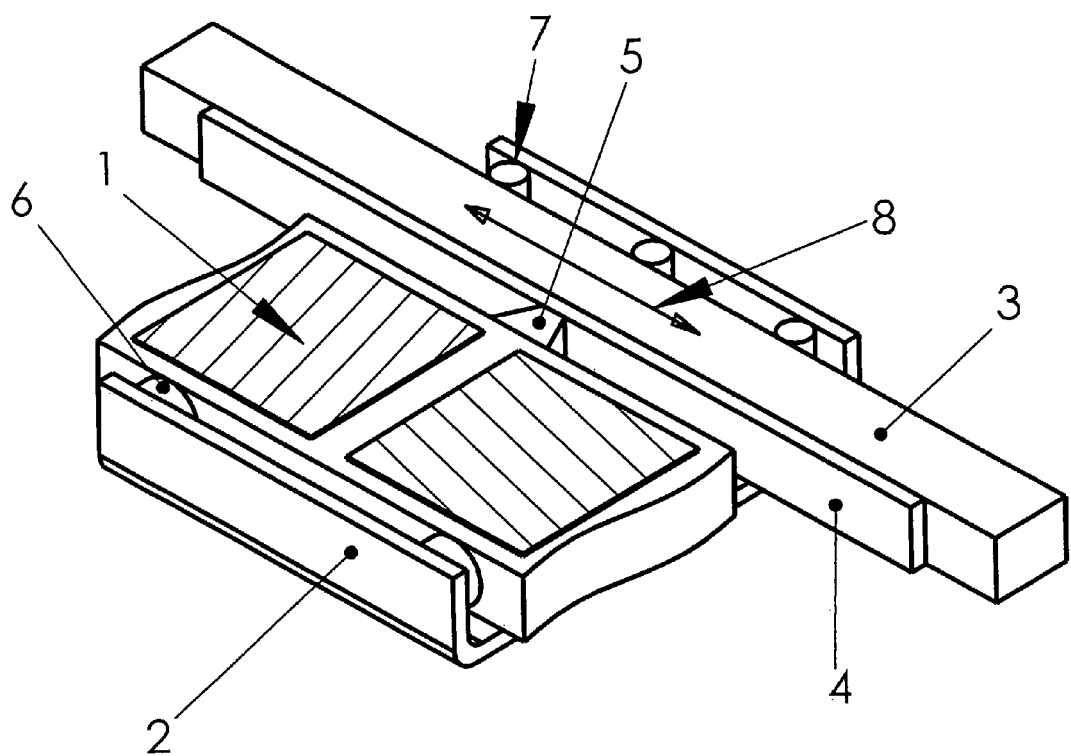
FIG. 1 shows the main modification of the inventive motor.

The inventive piezoelectric ultrasound motor includes a piezoelectric oscillator 1 which is arranged in a housing 2 and an element 3 to be moved with a friction strip 4 attached thereon (see FIG. 1). The piezoelectric oscillator 1 with the friction element 5 is elastically urged against the friction strip 4 by means of the pressure elements 4. The element 3 to be moved is fixed on the bearing 7 in the motor housing 2 so that it may move in the direction indicated by the arrow 8.

Figure 2:
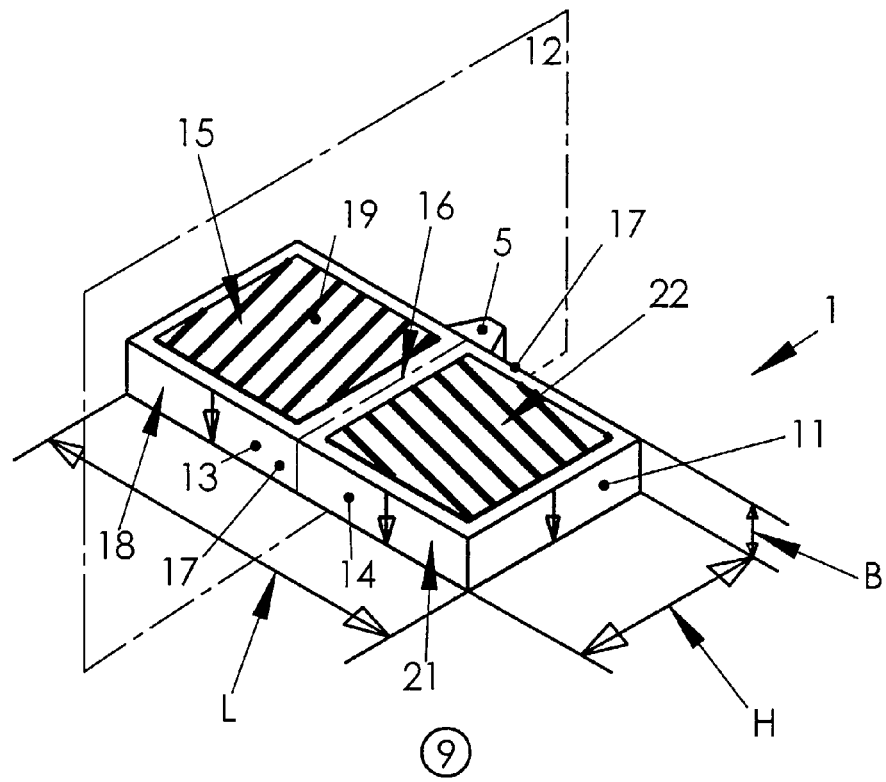
FIG. 2 shows the construction of the oscillator.
Figure 2:
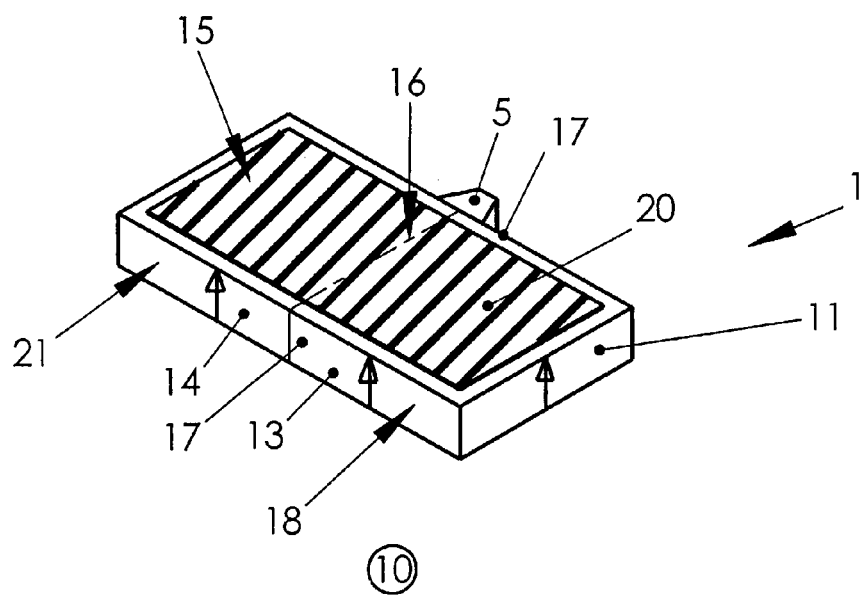

In FIG. 2, Items 9, 10, are a plan view and a bottom view, respectively, of the oscillator 1. The oscillator 1 is configured as a piezoelectric plate 11 with the length L, the height H, and the width B, and is divided by the dividing plane 12 into two identical parts 13, 14.

The dividing plane 12 passes through the centre of the oscillator length L and is perpendicular to the large side 15 of the oscillator. The trace 16 of the dividing plane 12 is indicated by means of a broken line on the oscillator 1. One or two friction elements 5 (not shown on the figure) are arranged at the long end faces 17 of the piezoelectric plate in the centre of the oscillator length L.

In the modification of the inventive motor under consideration, the part 13 of the oscillator 1 includes an asymmetrical generator 18 of asymmetrical acoustic waves. The asymmetrical generator is formed by an excitation electrode 19 and the common electrode 20 which are arranged on the large surfaces 15 of the polarised piezoelectric plate 11. The polarisation of the plate 11 is effected perpendicularly to the electrodes and is indicated e. g. in FIG. 1 by means of arrows.

The asymmetrical nature of the generator 18 is due to its asymmetrical position with respect to the dividing plane 12 and to the fact that upon its excitation an asymmetrical two-dimensional standing wave is generated in the oscillator. The wave may be of the first, second, or higher order. The length of the oscillator has the following relationship to the height and the order of the excited wave: L=K*H*n. K is a coefficient which depends on the width or the type, respectively, of the piezoceramic material. K≈0.5÷1. n is the order of the wave. n=2, 3, 4, . . . .

In this modification of the motor, the part 14 of the oscillator 1 may include a second self-contained asymmetrical generator 21 of asymmetrical acoustic waves, comprising the excitation electrode 22 and the common electrode 20.

Figure 3:
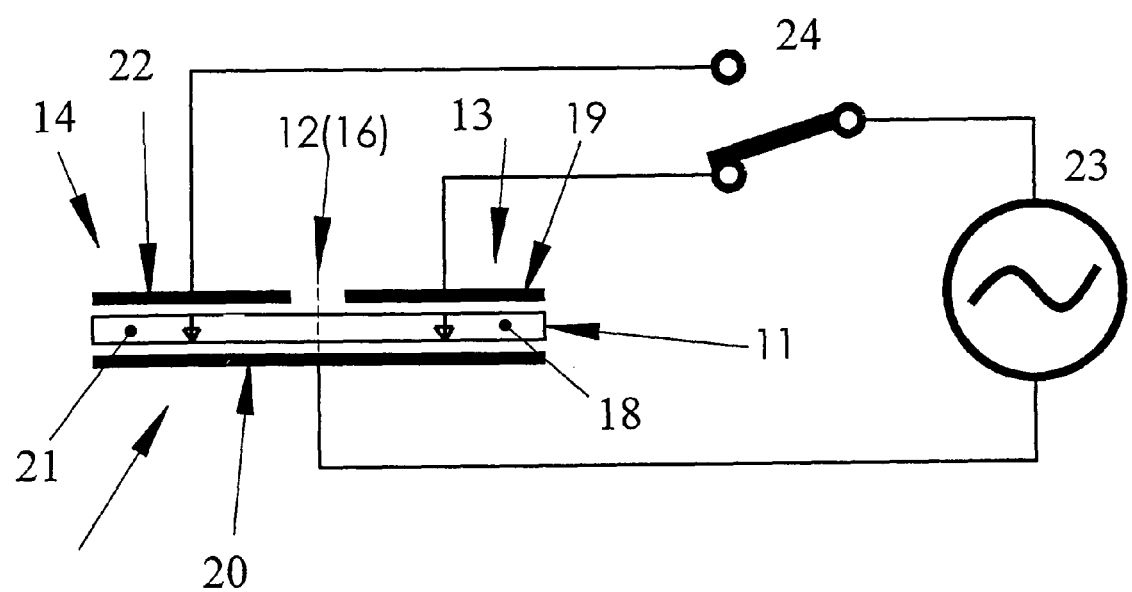
FIG. 3 shows electrical circuitry of the oscillator with the excitation source.

FIG. 3 shows an electrical circuitry of the excitation source 23 with the oscillator 1. The circuit diagram includes the change-over switch 24 by means of which the source 23 is electrically connected with the first 18 or the second 21 generator.

Figure 4:
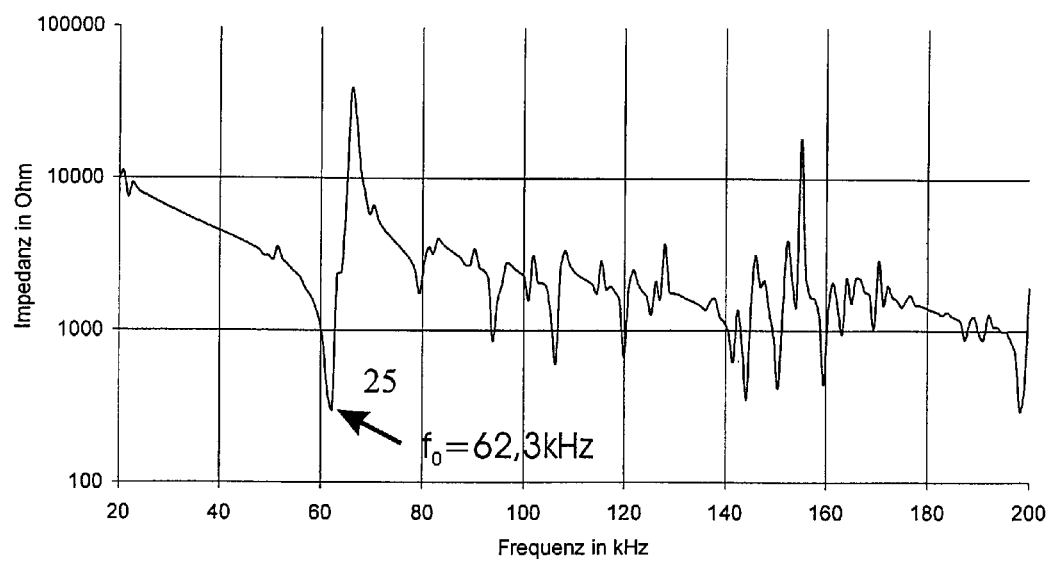
FIG. 4 shows the amplitude-frequency response of the electrical input impedance of the oscillator.

FIG. 4 shows the amplitude-frequency response of the electrical input impedance of the oscillator 1 with the dimensions 60×26×9 mm$^3$, made from piezoelectric ceramic material PIC 181 of Messrs PI Ceramic GmbH. The resonance point 25 indicates the resonance frequency $f_0$ which corresponds to the asymmetrical standing wave of the first order.

Figure 5:
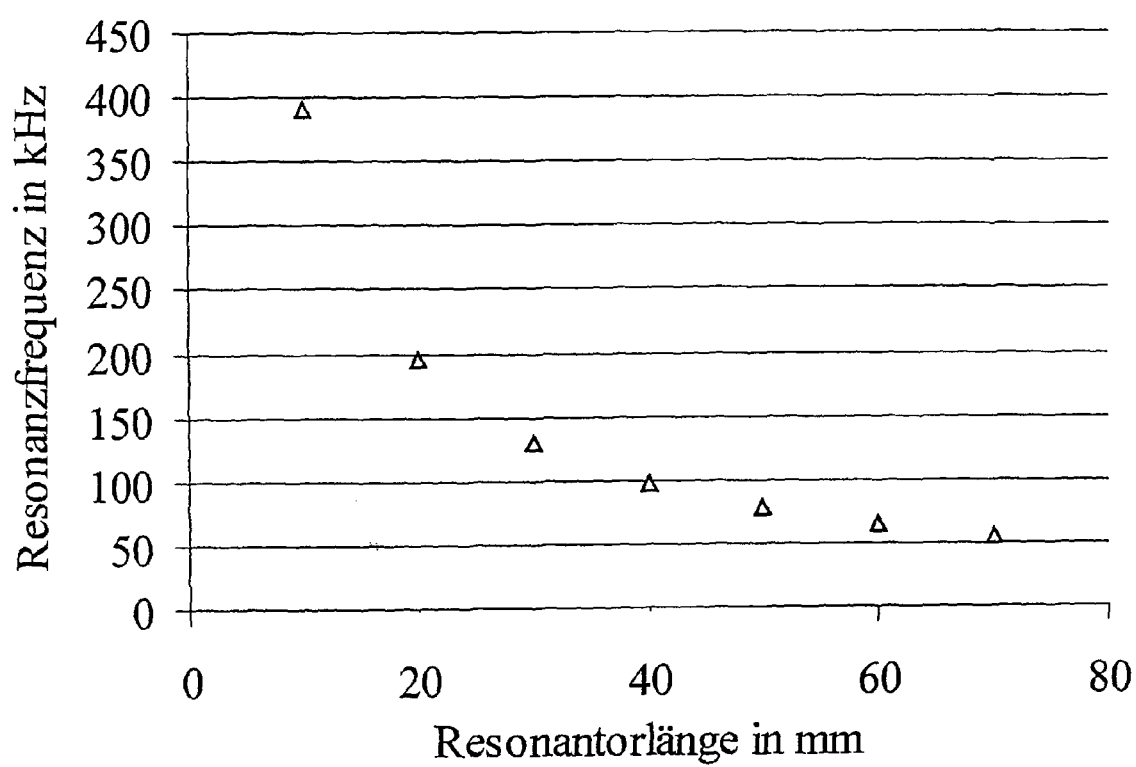
FIG. 5 shows the dependency of the oscillator resonance frequency from the oscillator length.

FIG. 5 shows the dependency of the oscillator resonance frequency $f_0$ (resonance point 25 in FIG. 4) as a function of the oscillator length L with a constant ratio oscillator length to oscillator height of L/H=2.25 as well as a constant ratio oscillator length to oscillator width of L/B=6.

Figure 6:
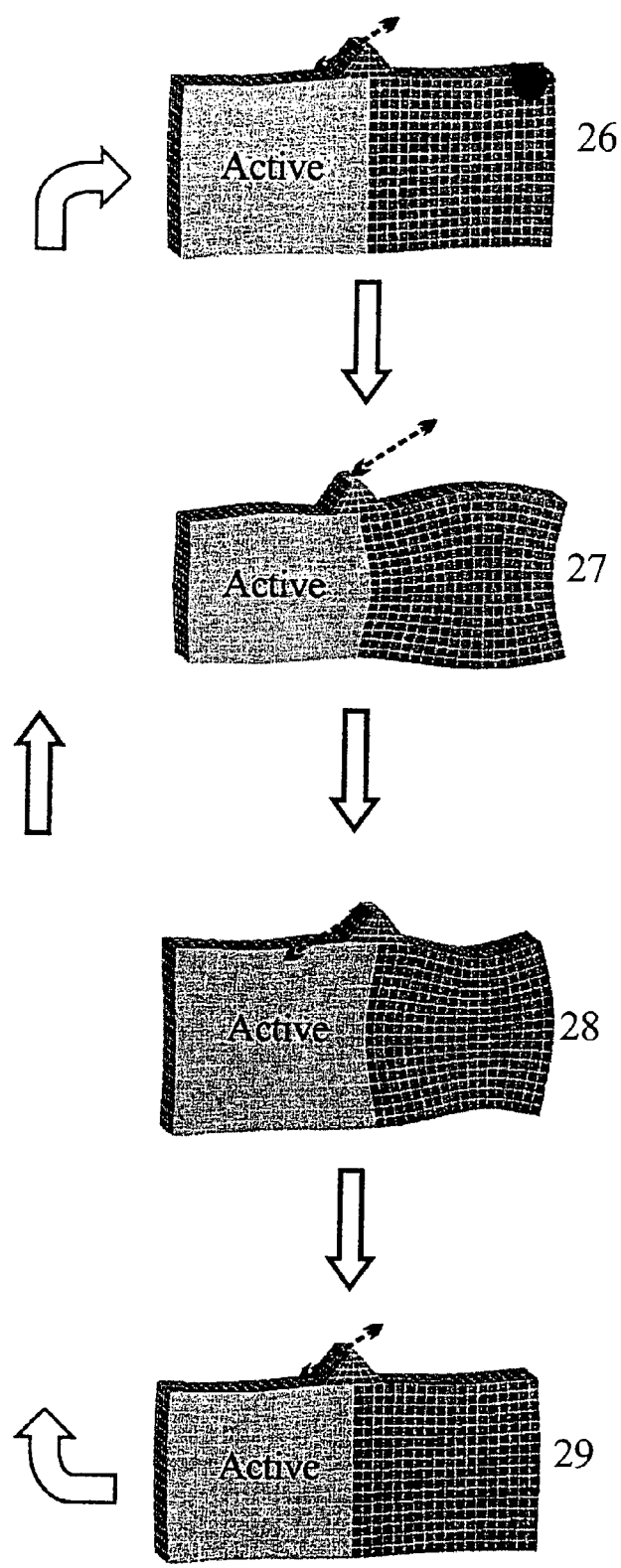
FIG. 6 shows the deformation of the oscillator.

Items 26, 27, 28, 29 of FIG. 6 illustrate deformations of the plate 11 of the oscillator 1 upon the excitation of an asymmetrical standing wave of the first order.

Figure 7:
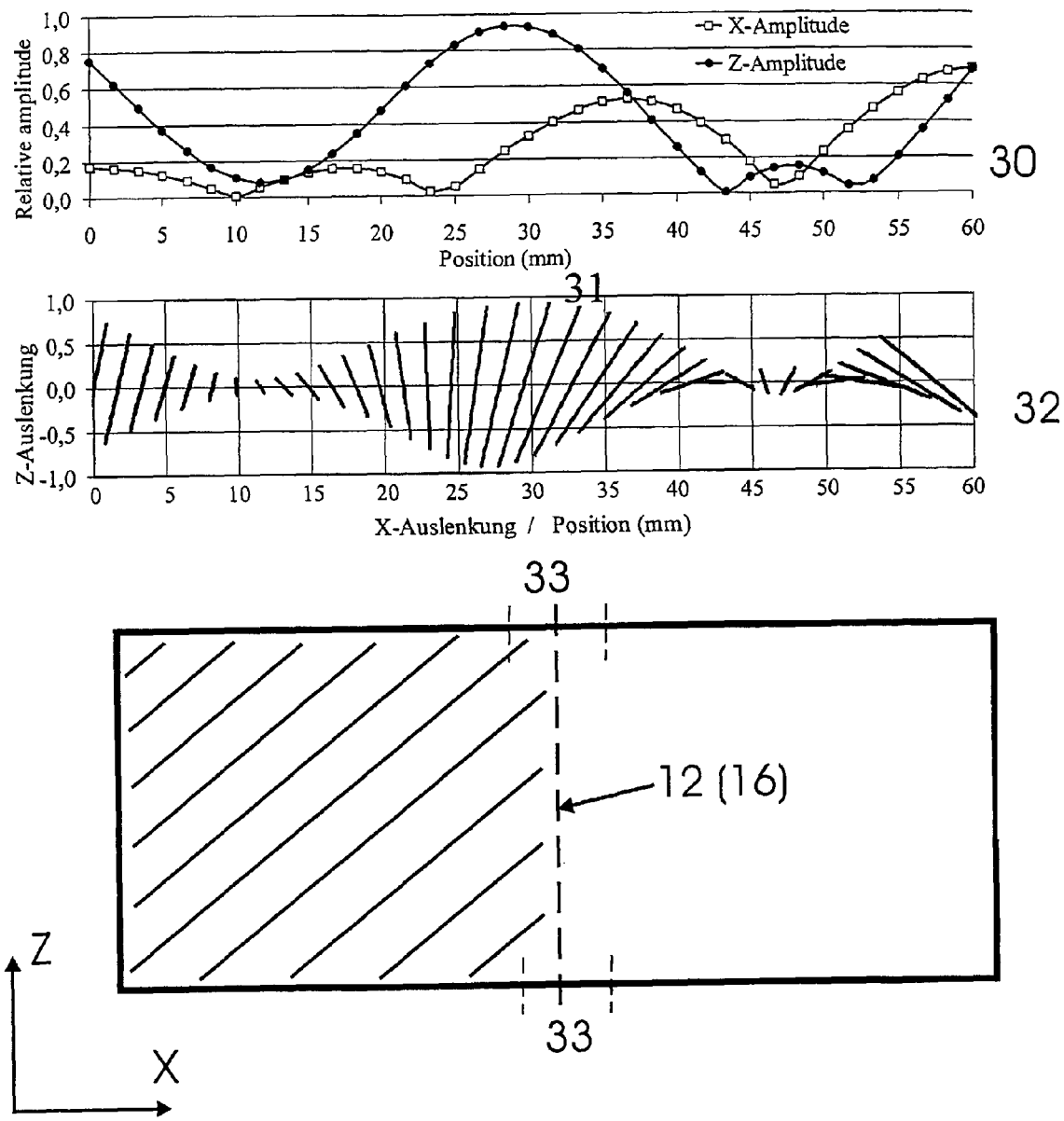
FIG. 7 shows amplitudes and motion paths of the points at the long end faces of the oscillator.

FIG. 7 shows vibration amplitudes (Item 30) as well as the motion paths (Item 32) of the points at the long end face 17 of the piezoelectric plate 11 upon the excitation of the asymmetrical standing wave of the first order.

Item 33 identifies the area within which the impact elements are arranged.

Figure 8:
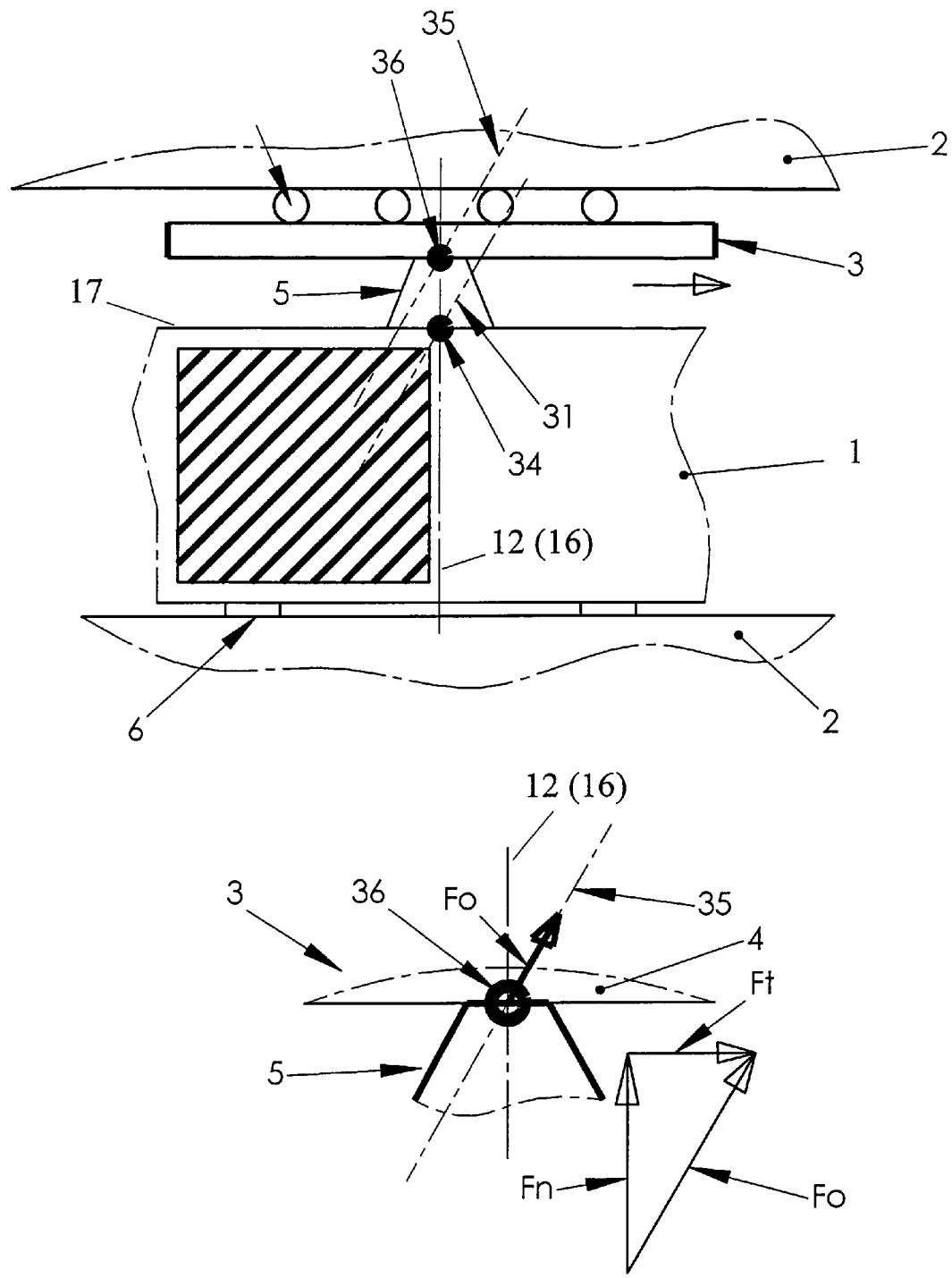
FIG. 8 is an explanatory illustration of the operation of the motor.

FIG. 8 explains the function of the inventive motor. In this figure, the motion path 32 of the point 34 at the long end face 17 as well as the motion path 35 of the point 36 of the friction element 5 are shown.

Figure 9:
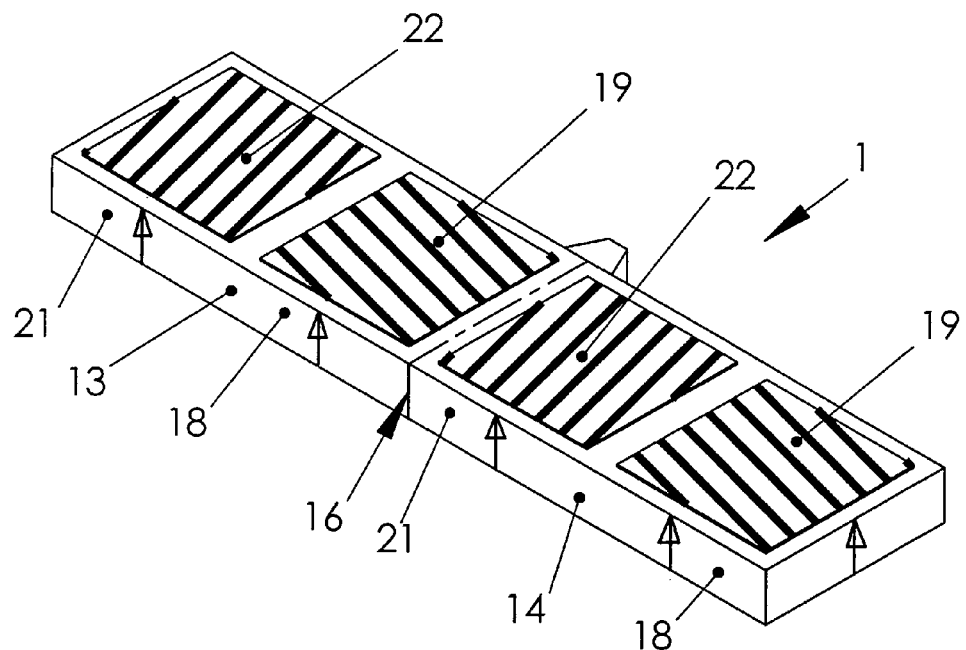
FIG. 9 shows the construction of the oscillator of the $2^{nd}$ order.
Figure 9:
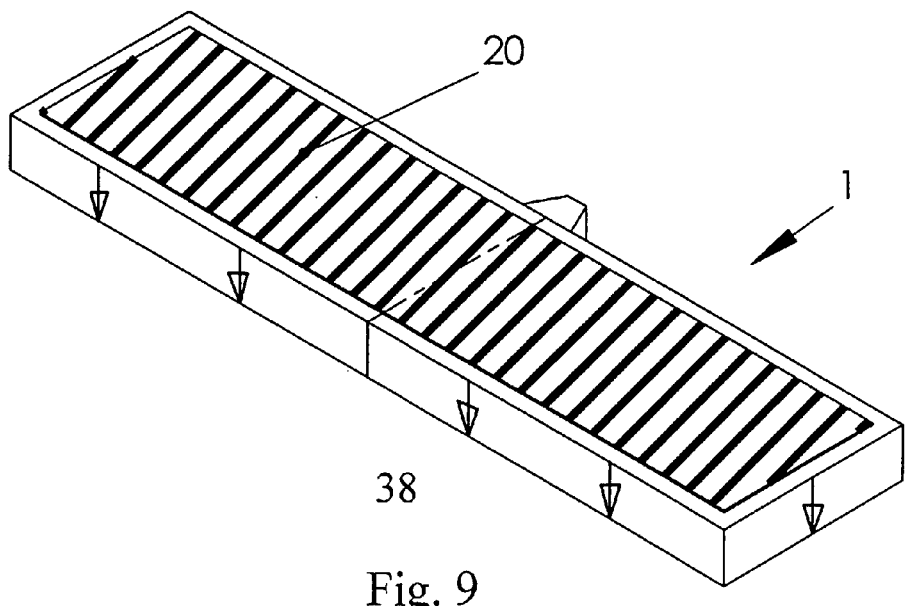

Items 37, 38 of FIG. 9 show an oscillator 1 in which an asymmetrical standing wave of the second order is excited. In this case, the generators 18, 21 include two electrodes 19, 22 each which are arranged on the oscillator parts 13, 14 at a distance of L/4.

Figure 10:
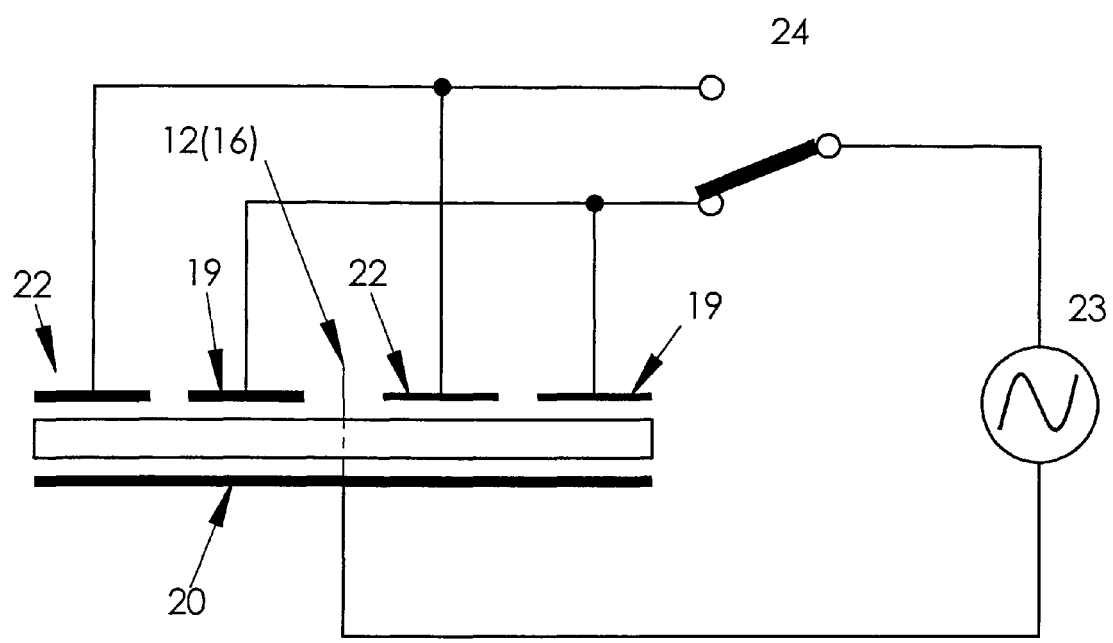
FIG. 10 shows electrical circuitry of the oscillator of the $2^{nd}$ order with the excitation source.

FIG. 10 shows the circuitry of the oscillator 1 of the inventive motor with the electric excitation source 23.

Figure 11:
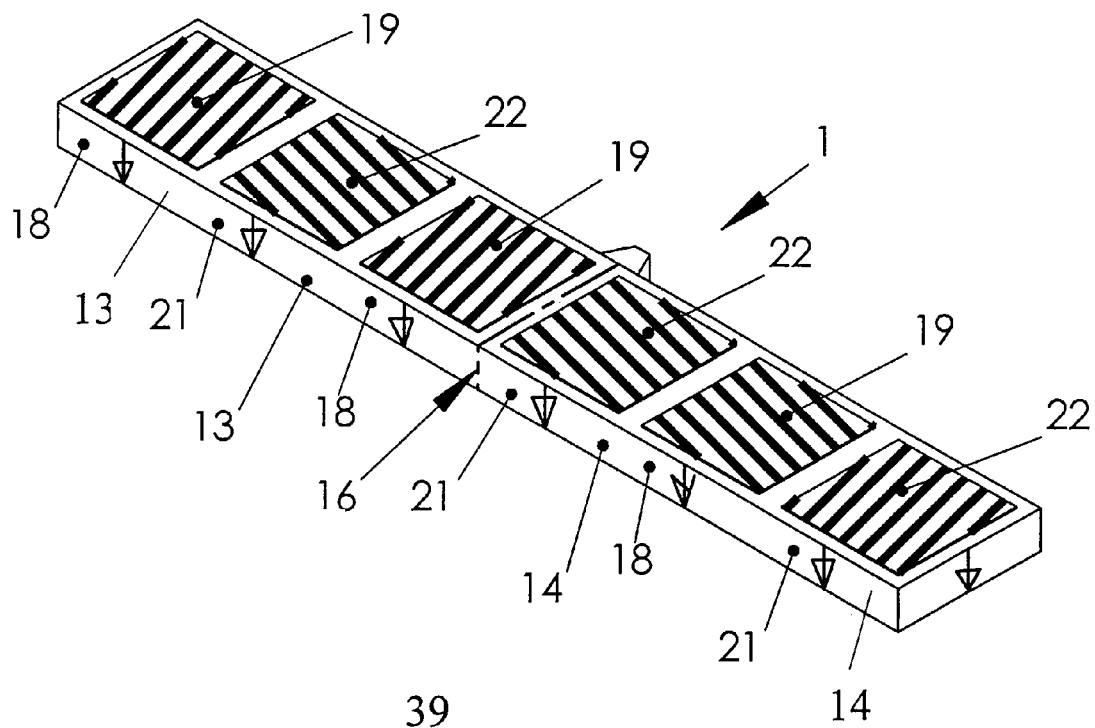
FIG. 11 shows the construction of the oscillator of the $3^{rd}$ order.
Figure 11:
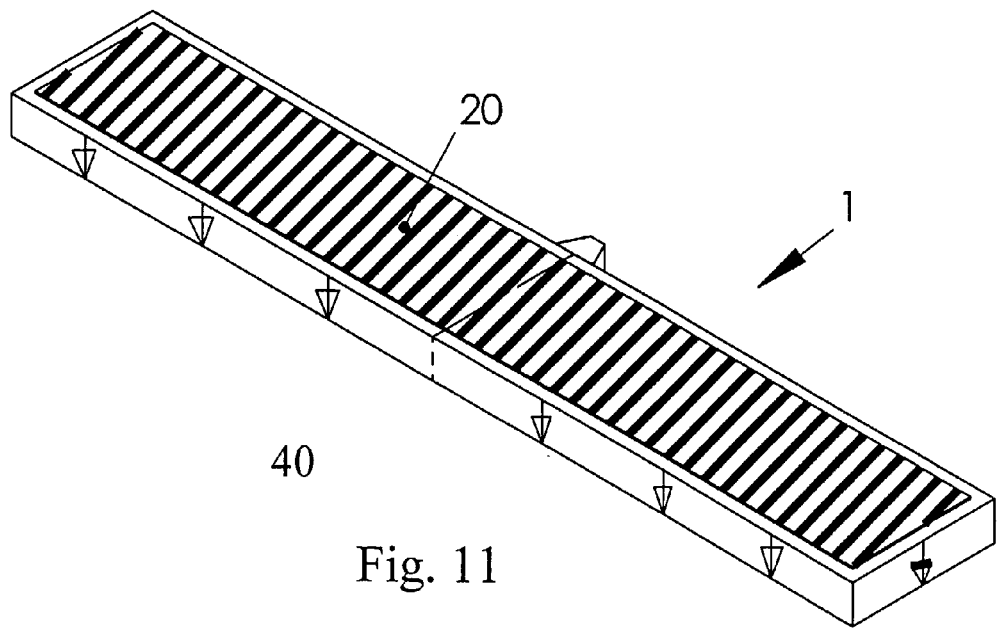

Items 39, 40 of FIG. 11 show another advantageous configuration modification of the inventive motor, with a standing wave of the third order being excited in the oscillator 1. In this case, the generators 18, 21 include three excitation electrodes 19 each which are arranged on the oscillator parts 13, 14 at a distance of L/6 from one another.

Figure 12:
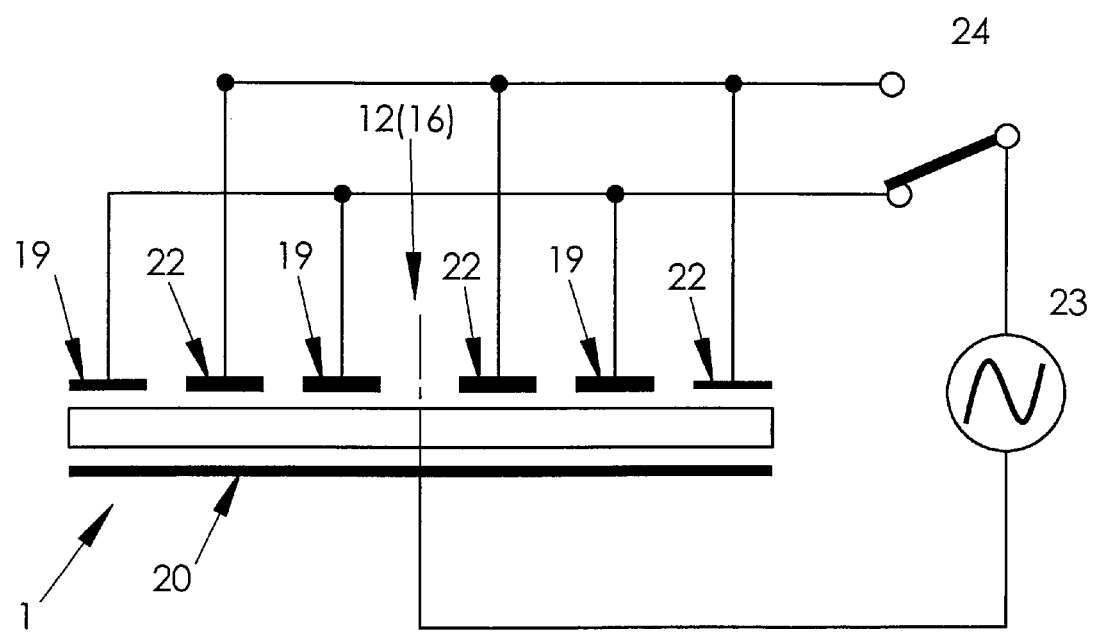
FIG. 12 shows electrical circuitry of the oscillator of the $3^{rd}$ order with the excitation source; und

FIG. 12 shows the circuitry of the oscillator 1 of this modification of the inventive motor with the electric excitation source 23.

Figure 13:
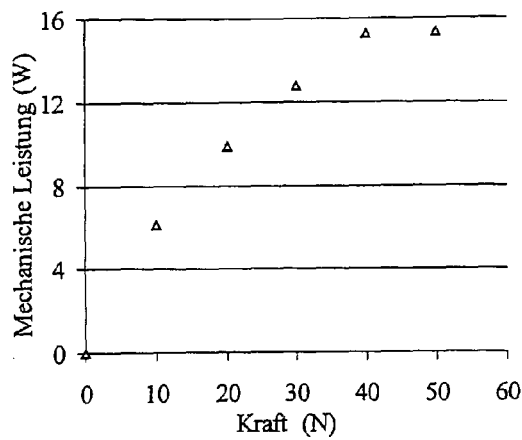
FIG. 13 shows the most important characteristics of the inventive motor.
Figure 13:
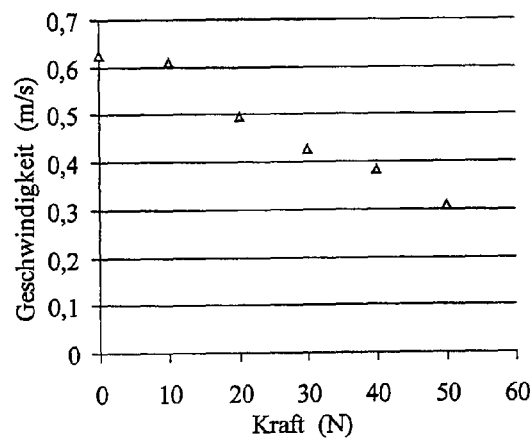
Figure 13:
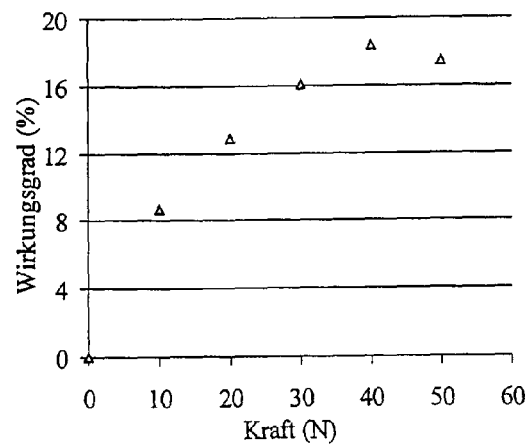

FIG. 13 shows the most important characteristics of the inventive motor with oscillator dimensions of 60×26×9 mm$^3$, made from the piezoelectric ceramic material PIC 181 of Messrs PI Ceramic GmbH. Item 41 shows the mechanic wattage-force characteristic, Item 42 the speed-force characteristic, and Item 43 the efficiency-force characteristic.

The operation will be considered with reference to a motor, at the oscillator 1 of which an asymmetric standing wave of the first order is excited, i. e. with an oscillator of the smallest length L≈2 H.

In order to operate the motor (FIG. 3), an electric alternating voltage is applied by the electrical excitation source 23 to the excitation electrode 19 and the common electrode 20. The frequency $f_0$ of the electric voltage corresponds to the resonance frequency of the oscillator, at which the asymmetrical standing wave may be excited (see FIG. 4). It is further to be noted that $f_0$ is dependent on the geometric dimensions of the oscillator rather than on the type of the piezoelectric ceramic material.

FIG. 5 shows the experimentally recorded dependency of the resonance frequency $f_0$ from the oscillator length L at a constant ratio of the oscillator length L to the oscillator height H of L/H=2.25 as well as at a constant ratio of the oscillator length L to the oscillator width B of L/B=6 for the oscillators made from the piezoelectric ceramic material PIC 181. For this dependency, the product of the oscillator length and the resonance frequency L*$f_0$ is a constant which in the present case amounts to 3911 kHz*mm. The constant may be used for the determination of the resonance frequency $f_0$ of the asymmetrical standing wave for any dimensions of the piezoceramic plate 11 of the oscillator 1. Due to the fact that no further resonances exist near the resonance frequency $f_0$ in the diagram of FIG. 4, it may be concluded that this constant uniquely defines the frequency of the asymmetrical standing wave.

Upon the excitation of the asymmetrical two-dimensional standing wave in the plate 11 of the oscillator 1, the plate is deformed as shown in FIG. 6. The four deformation phases (Items 26, 27, 28, 29) are shown at a time interval of one fourth of the oscillator vibration period.

The asymmetrical deformation of the oscillator plate 11 manifests itself in the asymmetrical distribution of vibration amplitudes of the points at the long end faces 17 along the oscillator length with respect to the dividing plane 12. Item 30 of FIG. 7 shows the vibration amplitudes in the X and Z direction, respectively. The points move along the paths 31 which are shown in Item 32. The motion paths 31 are straight lines which, depending on the position, form different angles with the oscillator end faces 17, and they are asymmetrically positioned with respect to the dividing plane 12. The asymmetry of the amplitude distribution along the oscillator length as well as the asymmetries in the spatial position of the motions paths resulting therefrom is caused by the asymmetry of the standing wave which is excited in the oscillator.

The friction element 5 which is arranged in the central area 33 vibrates along a straight line 31 (35) which is inclined relative to the dividing plane 12 (see FIG. 8). Upon its movement toward the element 3 to be moved, a force $F_0$ is generated between the friction element 5 and the friction strip 4, which may be broken down to the normal component $F_n$ and the tangential component $F_t$. The normal component is responsible for the friction force due to which the tangential component $F_t$ is transferred to the element 3 to be moved. The friction element 5 transfers a force impulse to the element to be moved, due to which the latter experiences a movement. During the return movement of the friction element 5, the force $F_0$ vanishes. The friction force between the friction elements 5 and the element 3 to be moved disappears. Due to its inertia, the element 3 to be moved continues its movement until the next impact. The direction of movement is indicated in FIG. 8 by means of an arrow.

Upon change-over of the switch 24, the position of the active generator with respect to the dividing plane 12 changes. This leads to the deformation pattern of the oscillator 1 to be mirrored. The amplitudes in the X and Z direction do not change in the central area 33 of the oscillator. Only the phase between the two components changes by 180°. The angle between the motions paths of the points in this area and the dividing plane 12 changes its sign. This results in a reverse movement of the element 3 to be moved.

Oscillators 1 with an excitation of asymmetrical standing waves of the second, third, and higher orders (see FIGS. 9, 10, 11, 12) have deformations in their central areas which are similar to those of the order 1 oscillator. Motors which use such oscillators have a similar mode of operation.

Items 41, 42, 43 of FIG. 13 show the most important characteristics of an embodiment of the inventive ultrasound motor with an oscillator motor of the dimensions 60×26×9 mm³, made from piezoelectric ceramic material PIC 181. The maximum speed of the rotor amounts to 600 mm/s, the maximum force is 50 N, and the maximum mechanical wattage is 15 W. The maximum efficiency of the motor is approx. 20%. The electric excitation voltage is 200 $V_{eff}$.

Compared to an ultrasound motor which is constructed to U.S. Pat. No. 5,616,980 of the type HR8 by Messrs Nanomotion, the described embodiment of the motor develops twice the speed of movement of the rotor as well as a 1.6 times higher force. The field strength in the oscillator is approximately a fourth of that of the motor by Messrs Nanomotion. The inventive embodiment includes only three connection lines, while the number of the HR8 motor is 40. This improves e. g. the reliability of the inventive motor enormously.

The manufacture of the inventive motors is clearly simpler, which results in considerably lower manufacturing costs. Moreover, the realisation of the motor configuration is definitely simpler.

LIST OF REFERENCE NUMERALS

1 Piezoelectric oscillator
2 Housing
3 Element to be moved (rotor)
4 Friction strip
5 Friction element
6 Pressure elements
7 Bearing
8 Direction of movement arrow
9 Plan view of the order 1 oscillator
10 Bottom view of the order 1 oscillator
11 Piezoelectric plate of the oscillator 1
12 Dividing plane
13 Part of the oscillator 1
14 Part of the oscillator 1
15 Large surface of the oscillator 1
16 Trace of the dividing plane 12
17 Long end faces
18 Self-contained asymmetrical generator of an asymmetrical acoustic standing wave
19 Excitation electrode of the generator 18
20 Common electrode
21 Second asymmetrical generator of an asymmetrical acoustic standing wave
22 Excitation electrode of the generator 21
23 Excitation source of the oscillator 1
24 Change-over switch
25 Resonance point
26 Deformation of the oscillator
30 Amplitude distribution of the point at the long end face 17 of the plate 11
31 Motion path of a point at the long end face 17 of the plate 11
32 Motion paths of the points at the long end face 17 of the plate 11
33 Area of the impact element 5
34 Point at the end face 17 of the plate 11
35 Motion path of the point 36 at the friction element 5
36 Point of the friction element 5
37 Plan view of the order 2 oscillator 1
38 Bottom view of the order 2 oscillator 1
39 Plan view of the order 3 oscillator 1
40 Bottom view of the order 3 oscillator 1
41 Characteristic mechanical wattage-force
42 Characteristic speed-force
43 Characteristic efficiency-force

The invention claimed is:

1. A piezoelectric ultrasound motor comprising:
an oscillator in the form of a piezoelectric plate of length L, height H and width B, said piezoelectric plate having a major surface; and
a friction element arranged at the oscillator and elastically pressed against a friction surface of an element to be moved, wherein
said friction element is arranged on a long end face of said piezoelectric plate,
said piezoelectric plate is divided into two identical parts by a dividing plane that extends perpendicular to said major surface, one of said identical parts including a first asymmetrical generator of an asymmetrical acoustic standing wave, said first asymmetrical generator, when activated, generating an asymmetrical two-dimensional standing wave having a resonant frequency $f_0$ that deforms said oscillator such that said friction element effects a first movement at a first non-zero angle relative to said long end face, a first driving force impulse being transferred, on account of said first movement, to said element to be moved, and
a product of said length L and resonant frequency $f_0$ is a constant value for a constant ratio of length L to height H and for a constant ratio of length L to width B.

2. The piezoelectric ultrasound motor according to claim 1, wherein, for a reversal of said movement of said element to be moved, another of said two identical parts comprises a second asymmetrical generator of an asymmetrical acoustic standing wave, said first and second asymmetrical generators being arranged symmetrically with respect to said dividing plane, said second asymmetrical generator, when activated, generating an asymmetrical two-dimensional standing wave having a resonant frequency $f_0$ that deforms said oscillator such that said friction element effects a second movement at a second non-zero angle relative to said long end face, said second angle being equal yet opposite to said first angle relative to said dividing plane, a second driving force impulse being transferred, on account of said second movement, to said element to be moved.

3. The piezoelectric ultrasound motor according to claim 1, wherein
   a ratio of said length L to said height H is 2.25,
   a ratio of said length L to said width B is 6 or an integer multiple thereof, and
   a product of said resonant frequency $f_0$ and said length L is 3911 KHz·mm or an integer multiple thereof.

4. A piezoelectric ultrasound motor comprising:
   an oscillator in the form of a piezoelectric plate of length L, height H and width B, said piezoelectric plate having a major surface; and
   a friction element arranged at the oscillator and elastically pressed against a friction surface of an element to be moved, wherein
   said friction element is arranged on a long end face of said piezoelectric plate,
   said piezoelectric plate is divided into two identical parts by a dividing plane that extends perpendicular to said major surface, one of said identical parts including a first asymmetrical generator of an asymmetrical acoustic standing wave, said first asymmetrical generator, when activated, generating an asymmetrical two-dimensional standing wave having a resonant frequency $f_0$ that deforms said oscillator such that said friction element effects a first movement at a first non-zero angle relative to said long end face, a first driving force impulse being transferred, on account of said first movement, to said element to be moved.

* * * * *